United States Patent
Uesaka et al.

(10) Patent No.: US 9,478,569 B2
(45) Date of Patent: Oct. 25, 2016

(54) SOLID-STATE IMAGING DEVICE AND ELECTRONIC DEVICE

(71) Applicant: Sony Corporation, Tokyo (JP)

(72) Inventors: Yusuke Uesaka, Kanagawa (JP); Atsuhiko Yamamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/512,200

(22) Filed: Oct. 10, 2014

(65) Prior Publication Data

US 2015/0108595 A1    Apr. 23, 2015

(30) Foreign Application Priority Data

Oct. 18, 2013  (JP) .................................. 2013-217006

(51) Int. Cl.
*H01L 27/14*    (2006.01)
*H01L 21/00*    (2006.01)
*H01L 27/146*   (2006.01)

(52) U.S. Cl.
CPC .............. *H01L 27/14603* (2013.01)

(58) Field of Classification Search
CPC ... H01L 25/048; H01L 27/288; H01L 27/30; H01L 27/32; H01L 27/3239; H01L 31/143; H01L 31/162; H01L 33/06; H01L 33/08; H01L 33/18; H01L 33/24; H01L 33/26; H01L 51/0032; H01L 51/50
USPC ............ 438/22–47, 69, 493, 503, 507, 956; 257/431, 432, 435, 443, 291, 292.13, 257/79–103, 918, 40, 642–643, 759
See application file for complete search history.

(56) References Cited

U.S. PATENT DOCUMENTS

| | | | |
|---|---|---|---|
| 2009/0207291 A1* | 8/2009 | Abe et al. ...................... 348/308 |
| 2010/0045837 A1* | 2/2010 | Yamashita .................... 348/308 |
| 2011/0159632 A1* | 6/2011 | Sueyoshi .............. C23C 16/345 438/72 |
| 2011/0233702 A1* | 9/2011 | Takahashi et al. ........... 257/432 |

FOREIGN PATENT DOCUMENTS

JP        2012-191116 A       10/2012

* cited by examiner

*Primary Examiner* — Julio J Maldonado
*Assistant Examiner* — Moin Rahman
(74) *Attorney, Agent, or Firm* — Sheridan Ross P.C.

(57) ABSTRACT

The present invention relates to a solid-state imaging device. In a pixel array section in the solid-state imaging device, a vertical signal line is provided right under power supply wiring apart from a floating diffusion region in order to reduce load capacitance of the vertical signal line. Furthermore, the power supply wiring is wired to make a cover rate of each vertical signal line with respect to the power supply wiring nearly uniform. As a result, it is possible to suppress variation of load capacitance of the vertical signal line for each pixel. It becomes possible to suppress deviation in a black level, variation of charge transfer, and variation of settling. It becomes possible to obtain an image with higher quality.

16 Claims, 11 Drawing Sheets

SOLID-STATE IMAGING DEVICE AND ELECTRONIC DEVICE

CROSS REFERENCE TO RELATED APPLICATIONS

This application claims the benefit of Japanese Priority Patent Application JP 2013-217006 filed on Oct. 18, 2013, the entire contents of which are incorporated herein by reference.

FIELD

The present disclosure relates to a solid-state imaging device and an electronic device. In particular, the present disclosure relates to a solid-state imaging device and an electronic device made capable of obtaining an image with higher quality.

BACKGROUND

In the past, a back-irradiation type solid-state imaging device having a photodiode which receives light from a subject provided between an on-chip lens which condenses light from the subject and a wiring layer provided with wiring for a transistor and the like which drive each pixel is known.

In the back-irradiation type solid-state imaging device, transistor wiring or the like is not provided between the lens which condenses light and the photodiode which receives light. Therefore, it is possible to make a pixel aperture large and receive more light. As a result, a high quality image can be obtained.

Meanwhile, in the back-irradiation type solid-state imaging device, inter-wiring capacitance such as load capacitance of a vertical signal line used to read out a signal obtained in a pixel has been increased due to miniaturization of the pixel size. In order to reduce the load capacitance of the vertical signal line, therefore, a technology of disposing the vertical signal line in an upper layer apart from a floating diffusion region layer is proposed (see, for example, PTL 1).

CITATION LIST

Patent Literature

PTL 1
 JP 2012-191116A

SUMMARY

Technical Problem

In the above-described technology, however, an image with sufficiently high quality could not be obtained.

For example, if the vertical signal line is disposed apart from the floating diffusion region layer, the load capacitance of the vertical signal line can be reduced.

However, the wiring capacitance increased by miniaturization of the pixel size varies for each pixel.

As a result, variation occurs in the load capacitance of the vertical signal line as well.

Accordingly, deviation in a black level between pixels, variation of charge transfer, variation of settling and the like are caused, resulting in degradation of image quality of an obtained image. In particular, in the back-irradiation type solid-state imaging device, power supply wiring having a wide line width exceeding the pixel size is used to suppress fluctuation in power supply voltage. Therefore, a cover rate with respect to the power supply wiring, i.e., an area of an overlapping portion between metal wiring connected to each pixel and the power supply wiring differs for each pixel. As a result, the wiring capacitance varies largely for each pixel.

The present technology has been achieved in view of such a situation. It is desirable to obtain an image with higher quality.

Solution to Problem

According to an aspect of the present technology, a solid-state imaging device includes: a substrate including a photoelectric conversion section provided for each pixel to receive light incident from a subject and conduct photoelectric conversion; a first wiring layer provided on the substrate to have wiring connected to the pixel; and a second wiring layer provided on the substrate to have power supply wiring wired to make an area of a region in each of the wiring overlapping the power supply wiring nearly uniform when seen from a normal line direction of the substrate.

The first wiring layer can be disposed between the substrate and the second wiring layer.

In the first wiring layer, the wiring which is long in a predetermined direction can be arranged in a plurality in a direction perpendicular to the predetermined direction.

The power supply wiring can be disposed to make a predetermined angle to the wiring when seen from the normal line direction.

In the second wiring layer, the power supply wiring which is long in a first direction and the power supply wiring which is long in a second direction perpendicular to the first direction can be provided.

The power supply wiring can be disposed to cross the wiring at a nearly right angle when seen from the normal line direction.

A plurality of the power supply wiring which is different in width from each other can be provided in the second wiring layer.

The first wiring layer can be provided right under the second wiring layer.

The wiring can be made a signal line provided to read out a voltage signal depending upon charge obtained by the photoelectric conversion section.

The wiring can be made driver wiring provided to drive elements provided in the pixel.

The solid-state imaging device can be made a back-irradiation type imaging device.

The power supply wiring can be made wider in width than the pixel.

According to the first aspect of the present technology, there is provided a substrate including a photoelectric conversion section provided for each pixel to receive light incident from a subject and conduct photoelectric conversion; a first wiring layer provided on the substrate to have wiring connected to the pixel; and a second wiring layer provided on the substrate to have power supply wiring wired to make an area of a region in each of the wiring overlapping the power supply wiring nearly uniform when seen from a normal line direction of the substrate.

According to a second aspect of the present technology, an electronic device includes a solid-state imaging device, the solid-state imaging device including: a substrate including a photoelectric conversion section provided for each pixel to receive light incident from a subject and conduct photoelectric conversion; a first wiring layer provided on the substrate to have wiring connected to the pixel; and a second wiring layer provided on the substrate to have power supply wiring wired to make an area of a region in each of the wiring overlapping the power supply wiring nearly uniform when seen from a normal line direction of the substrate.

According to the second aspect of the present technology, there is provided a substrate including a photoelectric conversion section provided for each pixel to receive light incident from a subject and conduct photoelectric conversion; a first wiring layer provided on the substrate to have wiring connected to the pixel; and a second wiring layer provided on the substrate to have power supply wiring wired to make an area of a region in each of the wiring overlapping the power supply wiring nearly uniform when seen from a normal line direction of the substrate.

Advantageous Effects of Invention

According to an first aspect and an second aspect of the present technology, an image with higher quality can be obtained.

The effect described here is not necessarily restricted, but the effect may be any effect described in the present disclosure.

DESCRIPTION OF EMBODIMENTS

Hereinafter, embodiments of the present technology will be described with reference to the drawings.

First Embodiment

Configuration Example of Solid-State Imaging Device

Figure 1:
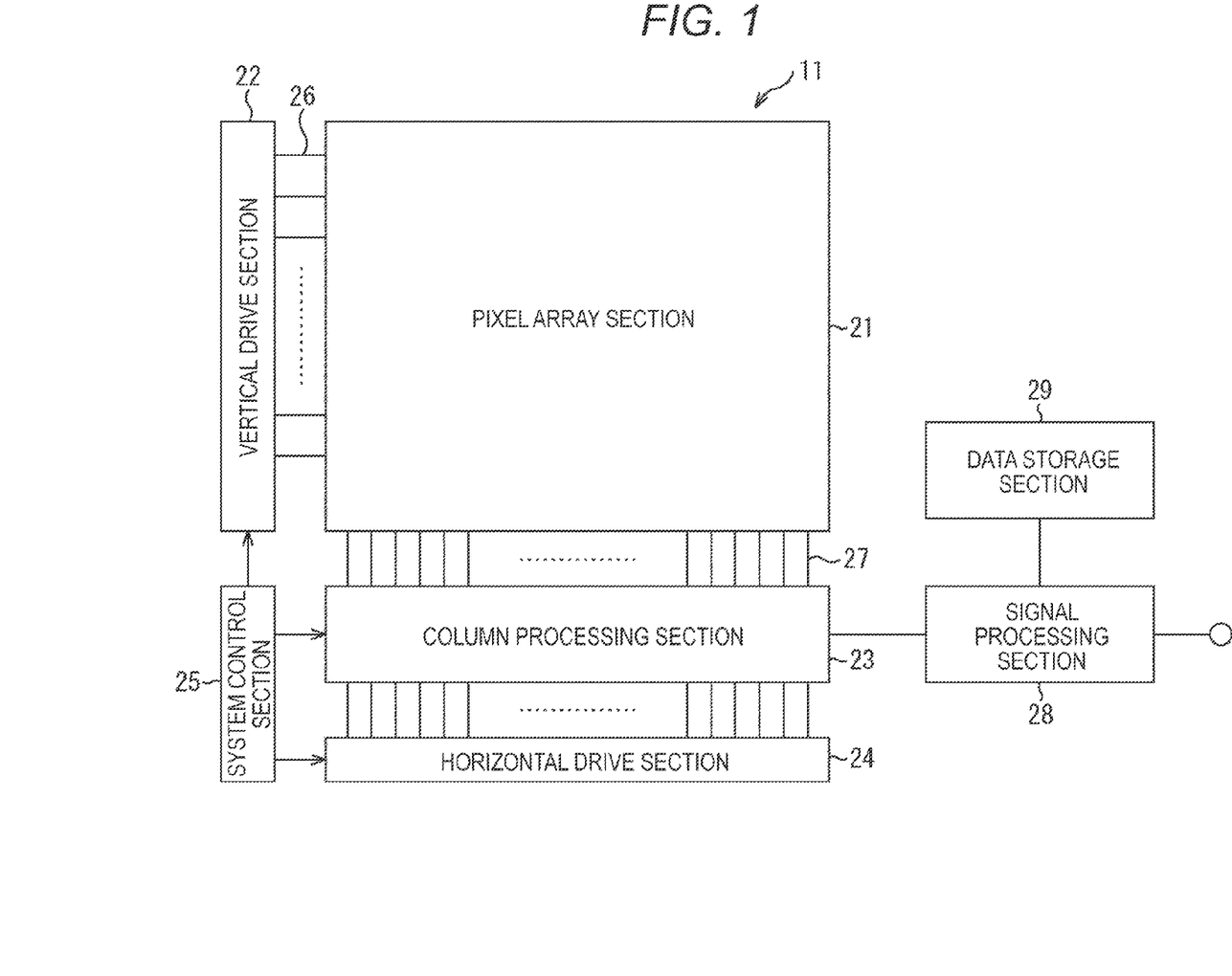
FIG. 1 is a diagram showing a configuration example of a solid-state imaging device.

First, a configuration example of a solid-state imaging device according to the present technology will be described. FIG. 1 is a diagram showing a configuration of an embodiment of a solid-state imaging device according to the present technology.

A solid-state imaging device 11 is a back-irradiation type image sensor including, for example, a CMOS (Complementary Metal Oxide Semiconductor) image sensor or the like. The solid-state imaging device 11 receives light from a subject, conducts photoelectric conversion, generates an image signal, and thereby picks up an image.

The back-irradiation type image sensor is an image sensor having a configuration in which a photodiode which receives light from a subject is provided between a light receiving plane on which light from the subject is incident, that is, an on-chip lens which condenses light, and a wiring layer provided with wiring for a transistor and the like which drive each pixel.

The solid-state imaging device 11 includes a pixel array section 21, a vertical drive section 22, a column processing section 23, a horizontal drive section 24, a system control section 25, a pixel drive line 26, a vertical signal line 27, a signal processing section 28, and a data storage section 29.

In the solid-state imaging device 11, the pixel array section 21 is formed on a semiconductor substrate (chip) which is not illustrated and in addition, the vertical drive section 22 to the system control section 25 are integrated on the semiconductor substrate.

The pixel array section 21 includes pixels each having a photodiode functioning as a photoelectric conversion section which generates and stores charge depending upon the quantity of light incident from the subject. Pixels included in the pixel array section 21 are arranged two-dimensionally in a lateral direction (row direction) and a longitudinal direction (column direction) in FIG. 1.

For example, in the pixel array section 21, the pixel drive line 26 is wired along the row direction for each pixel row including pixels arranged in the row direction and the vertical signal line 27 is wired along the column direction for each pixel column including pixels arranged in the column direction.

The vertical drive section 22 includes shift registers, address decoders, and the like. The vertical drive section 22 supplies signals or the like to pixels via a plurality of pixel drive lines 26, and thereby drives the pixels in the pixel array section 21 with all pixels simultaneously, with a row taken as the unit, or the like.

The column processing section 23 reads signals from pixels via the vertical signal line 27 for each pixel column in the pixel array section 21, conducts noise removal processing, correlated double sampling processing, A/D (Analog to Digital) conversion processing, and the like, and generates a pixel signal.

The horizontal drive section 24 includes shift registers, address decoder, and the like. The horizontal drive section 24 selects a unit circuit corresponding to a pixel column in the column processing section 23 in order.

Owing to selective scan conducted by the horizontal drive section 24, the pixel signal subjected to signal processing for each unit circuit in the column processing section 23 is output to the signal processing section 28 in order.

The system control section 25 includes a timing generator which generates various timing signals, and the like.

The system control section 25 conducts drive control on the vertical drive section 22, the column processing section 23 and the horizontal drive section 24 on the basis of the timing signals generated by the timing generator.

While temporarily storing data in the data storage section 29 as occasion demands, the signal processing section 28 conducts signal processing such as arithmetic processing on the pixel signal supplied from the column processing section 23, and outputs an image signal including each pixel signal.

Figure 2:
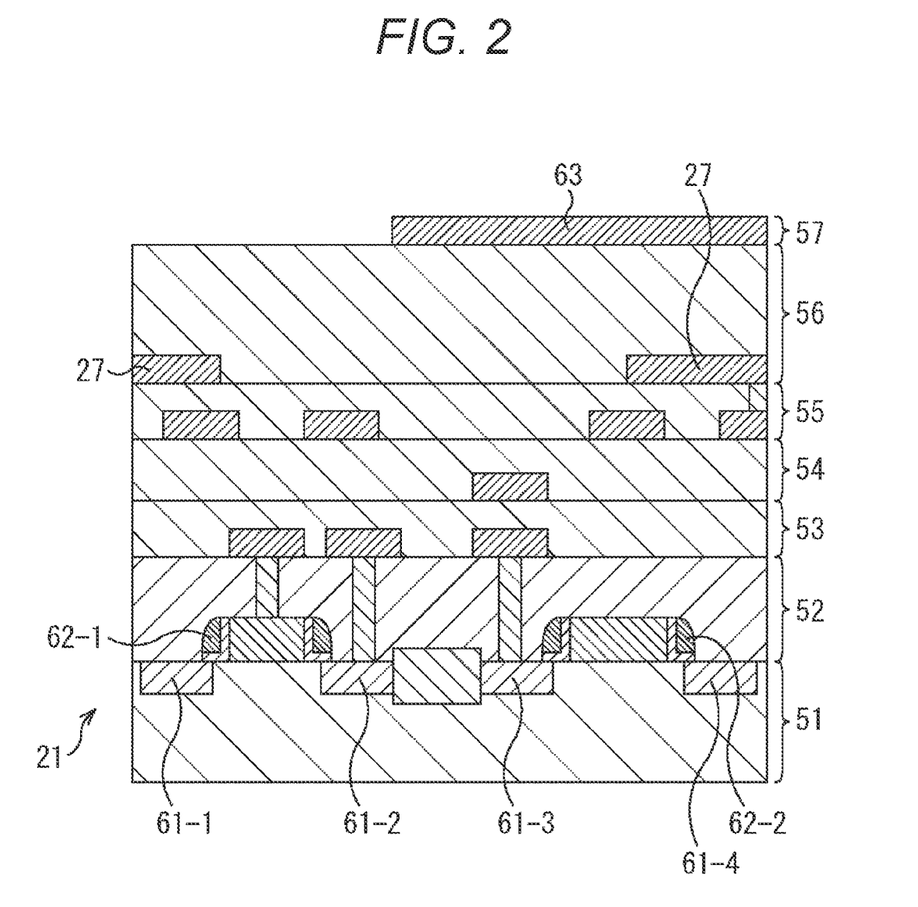
FIG. 2 is a diagram showing a configuration of a pixel array section.

A sectional structure of the pixel array section 21 included in the solid-state imaging device 11 will now be described. A section of the pixel array section 21 has a configuration shown in, for example, FIG. 2. FIG. 2 shows a portion of the pixel array section 21 at the time when the pixel array section 21 is seen in an upward direction from the bottom in FIG. 1.

In this example, a plurality of wiring layers 52 to 57 is laminated on a substrate 51 formed of silicon or the like.

A floating diffusion region 61-1 to a floating diffusion region 61-4 are provided in the substrate 51 to store charges transferred from photodiodes respectively provided in pixels in the pixel array section 21. The floating diffusion region 61-1 to the floating diffusion region 61-4 are connected to wiring provided in the wiring layer 53. The floating diffusion region 61-1 to the floating diffusion region 61-4 are hereinafter referred to simply as a floating diffusion region 61 as well unless it is necessary to especially make a discrimination among them. The floating diffusion region 61 is referred to as floating diffusion as well.

Furthermore, on-chip lenses and color filters, which are not illustrated, are provided in a lower part in the substrate 51 shown in FIG. 2. Light from the subject is incident on the substrate 51 from a downward direction in FIG. 2.

A reset transistor 62-1 and a reset transistor 62-2 are provided in the wiring layer 52 to reset potential of the floating diffusion region 61. The reset transistor 62-1 and the reset transistor 62-2 are hereinafter referred to simply as a reset transistor 62 as well unless it is necessary to especially make discrimination between them.

Various kinds of wiring, such as driver wiring connected to elements such as the reset transistor 62 provided in the pixel array section 21 and wiring connected to portions of pixels such as the floating diffusion region 61, are provided in the wiring layer 53, the wiring layer 54 and the wiring layer 55. For example, the driver wiring connected to elements such as the reset transistor 62 is wiring provided to drive those elements, and is connected to the pixel drive line 26 shown in FIG. 1.

The vertical signal line 27 is provided in the wiring layer 56 to read out a voltage signal obtained by converting charge stored in the floating diffusion region 61 to voltage, to the column processing section 23. The wiring layer 57 is a power supply wiring layer. Power supply wiring 63 is provided in the wiring layer 57 to supply power (voltage) to the pixels included in the pixel array section 21.

Meanwhile, in the pixel array section 21, capacitance occurs between the vertical signal line 27 and the power supply wiring 63, between the vertical signal line 27 and the floating diffusion region 61, and between the vertical signal line 27 and other wiring. In particular, capacitance occurring between two lines of wiring, for example, capacitance occurring between the vertical signal line 27 and wiring such as the power supply wiring 63 is referred to as inter-wiring capacitance.

Capacitance added to the vertical signal line 27 by the inter-wiring capacitance or the like is referred to as load capacitance. As a matter of course, inter-wiring capacitance also occurs on wiring different from the vertical signal line 27.

For example, if the load capacitance of the vertical signal line 27 in the pixel array section 21 becomes large, the efficiency of conversion from charge stored in the floating diffusion region 61 to a voltage signal falls. Furthermore, if variation occurs in the inter-wiring capacitance of the vertical signal line 27 or other wiring for each pixel, the image quality of an image picked up by the solid-state imaging device 11 degrades.

Figure 3:
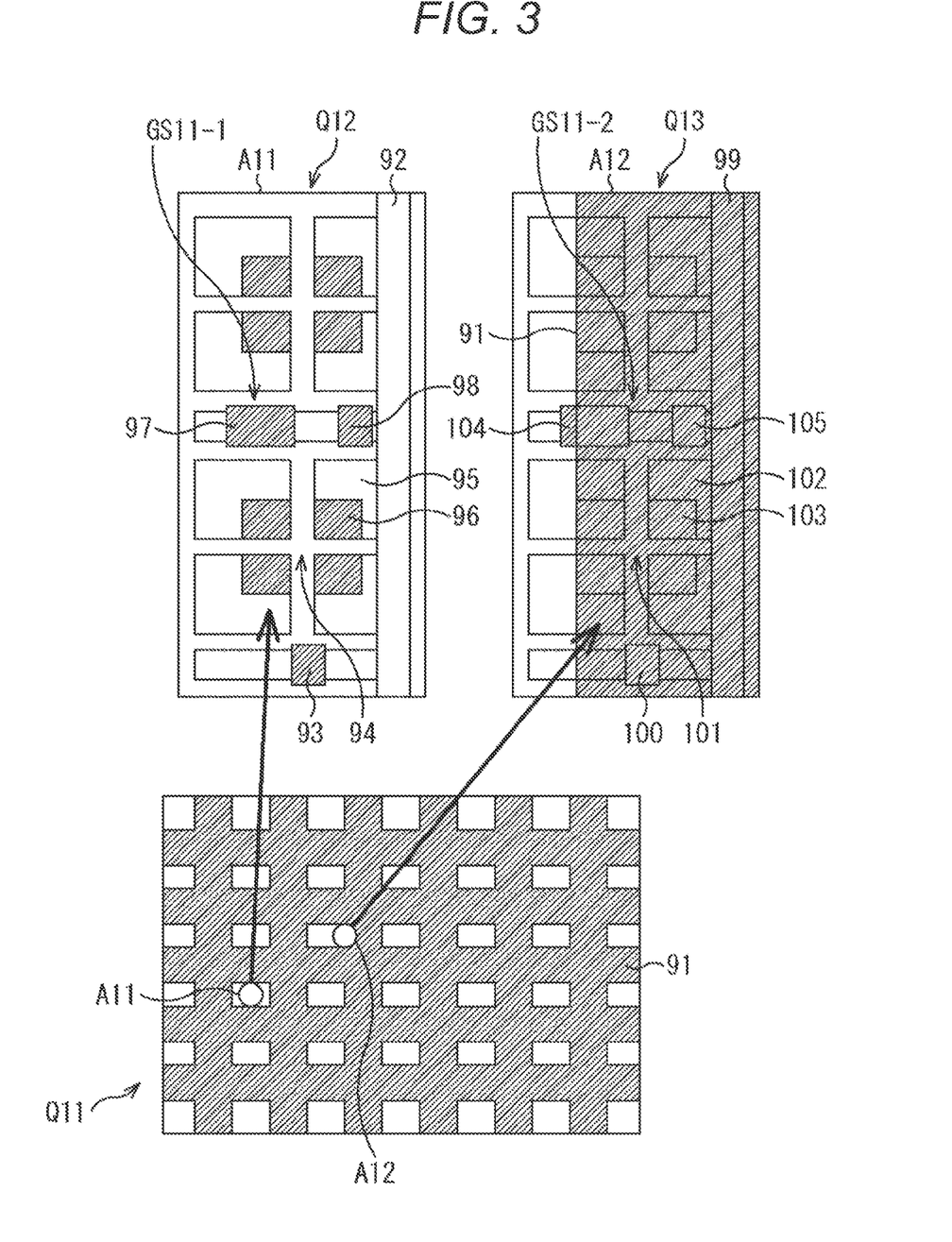
FIG. 3 is a diagram for explaining variation of power supply wiring and inter-wiring capacitance.

It is supposed that, for example, power supply wiring in a power supply layer is wired in a vertical direction and a horizontal direction as indicated by an arrow Q11 in FIG. 3. FIG. 3 is a diagram obtained when the pixel array section is seen from a direction perpendicular to a light receiving plane of the pixel array section. Power supply wiring 91 includes wiring extending in a vertical direction in FIG. 3 and wiring extending in a horizontal direction in FIG. 3.

Here, several pixels and a vertical signal line connected to those pixels are disposed on a depth side of an illustrated region A11 where the power supply wiring 91 is not wired as indicated by an arrow Q12. A diagram indicated by the arrow Q12 is an expanded view of a portion of the region A11 in the power supply layer indicated by the arrow Q11.

In this example, a pixel GS11-1 is provided in the region A11. The pixel GS11-1 is connected to a vertical signal line 92 which is long in a longitudinal direction (vertical direction) in FIG. 3.

If in the pixel GS11-1 a floating diffusion region 94 is reset by a reset transistor 93, then charge stored in a photodiode 95 is transferred to the floating diffusion region 94 by a transfer transistor 96. Then, charge stored in the floating diffusion region 94 is converted to a voltage signal by an amplification transistor 97, and the voltage signal is output to the vertical signal line 92 via a selection transistor 98. In this example, the reset transistor 93 to the selection transistor 98 are provided as elements included in the pixel GS11-1.

It is appreciated that the pixel GS11-1 and the vertical signal line 92 connected to the pixel GS11-1 do not overlap the power supply wiring 91 in the power supply layer when they are seen from a direction perpendicular to the light receiving plane of the pixel array section.

On the other hand, several pixels and a vertical signal line connected to those pixels are also disposed on a depth side of an illustrated region A12 where the power supply wiring 91 is wired as indicated by an arrow Q13.

A diagram indicated by the arrow Q13 is an expanded view of a portion of the region A12 in the power supply layer indicated by the arrow Q11.

In this example, a pixel GS11-2 is provided in the region A12. The pixel GS11-2 is connected to a vertical signal line 99 which is long in a longitudinal direction (vertical direction) in FIG. 3. Furthermore, a reset transistor 100, a floating diffusion region 101, a photodiode 102, a transfer transistor 103, an amplification transistor 104, and a selection transistor 105 are provided in the pixel GS11-2. The reset transistor 100 to the selection transistor 105 are similar to the reset transistor 93 to the selection transistor 98, and consequently description of them will be omitted.

It is appreciated that the pixel GS11-2 and the vertical signal line 99 connected to the pixel GS11-2 each have most of the region or the whole region overlapping the power supply wiring 91 in the power supply layer when they are seen from a direction perpendicular to the light receiving plane of the pixel array section.

In a case where the power supply wiring 91 obtained by arranging wiring which is long in the vertical direction and wiring which is long in the horizontal direction respectively in the vertical direction and the horizontal direction is disposed in the power supply layer in this way, the cover rate with respect to the power supply wiring 91 differs among pixels and among metal wiring such as vertical signal lines. In other words, an area of a region overlapping the power supply wiring 91 differs when seen from a direction perpendicular to the light receiving plane of the pixel array section.

Therefore, inter-wiring capacitance of wiring connected to a pixel varies for each pixel. Accordingly, deviation in the black level, variation of charge transfer, and variation of settling are caused, resulting in degradation of image quality of the obtained image.

Specifically, if, for example, inter-wiring capacitance for each pixel, especially inter-wiring capacitance (load capacitance) of the vertical signal line varies, a difference is caused in the amount of charge transferred from the photodiode to the floating diffusion region among pixels, even if the same amount of charge is stored in the photodiode. This results in charge transfer variation.

Figure 4:
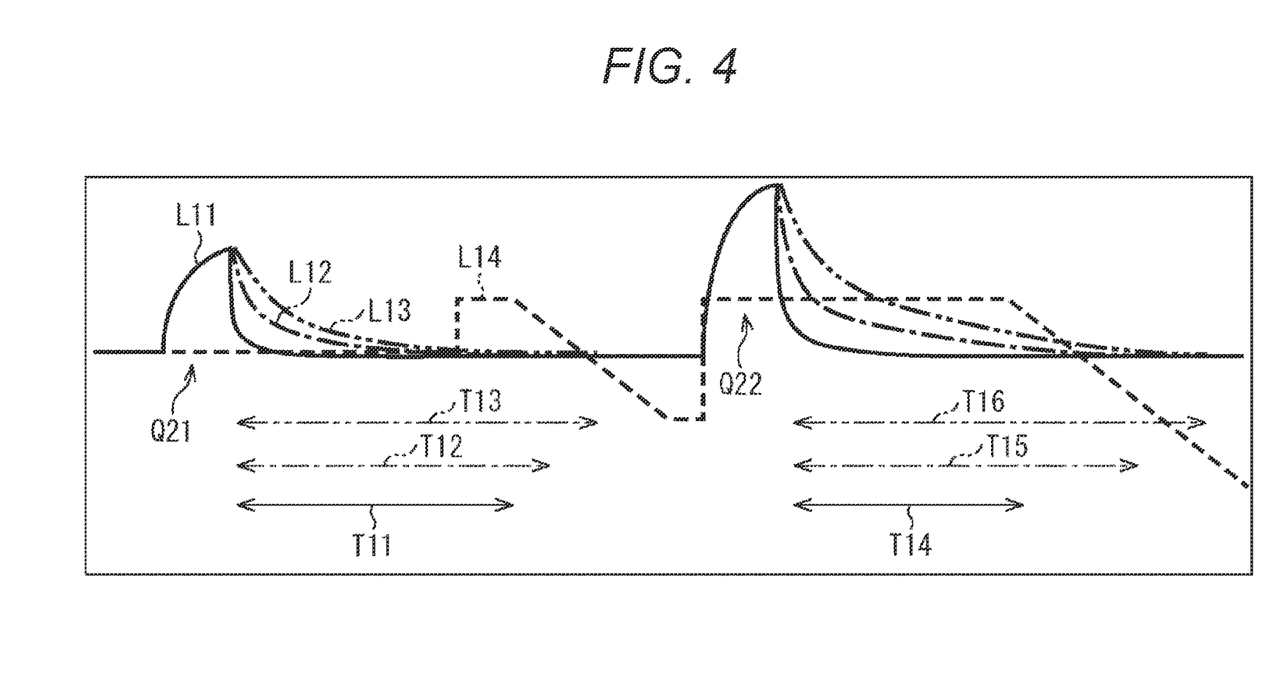
FIG. 4 is a diagram for explaining variation of settling.

Furthermore, if variation occurs in, for example, the load capacitance of the vertical signal line, variation of settling also occurs as shown in, for example, FIG. 4.

In FIG. 4, the ordinate axis and the abscissa axis indicate voltage and time.

In FIG. 4, a curve L11 to a curve L13 indicate levels of a voltage signal read out by respective different vertical signal lines. A broken line L14 indicates a level of a reference signal used in a subsequent stage.

The reference signal is utilized to read the level of the voltage signal.

Portions of the curve L11 to the curve L13 indicated by an arrow Q21 indicate levels of the voltage signal at the time of readout of the black level of each pixel.

Portions of the curve L11 to the curve L13 indicated by an arrow Q22 indicate levels of the voltage signal at the time of readout of the signal level of each pixel. Then, a difference between the black level and the signal level read out is used as a pixel value of each pixel.

In this example, variation occurs in the load capacitance (inter-wiring capacitance) of vertical signal lines.

Accordingly, as indicated by the curve L11 to the curve L13, there is also variation in time taken for the level of the voltage signal to return to a determinate level before readout, after readout of the black level or after readout of the signal level.

In FIG. 4, a period T11 to a period T13 indicate settling time after the black level readout of the voltage signals indicated by the curve L11 to the curve L13. A period T14 to a period T16 indicate settling time after the signal level readout of the voltage signals indicated by the curve L11 to the curve L13. It is appreciated that variation of settling occurs if there is variation in the load capacitance of the vertical signal lines in this way.

If the settling time becomes long, the black level becomes large and thus deviation in the black level occurs and consequently variation in the black level for each pixel occurs.

According to a power supply wiring pattern in the power supply layer, the cover rate with respect to the power supply wiring differs for each pixel as described heretofore. Therefore, variation occurs in inter-wiring capacitance of the vertical signal line and other wiring for each pixel, and consequently deviation in the black level, variation of charge transfer, variation of settling and the like are caused. As a result, the image quality of the image degrades. In particular, if the load capacitance of the vertical signal line connected to the floating diffusion region becomes large or variation occurs in load capacitance for each pixel, degradation of the image quality becomes remarkable.

Figure 5:
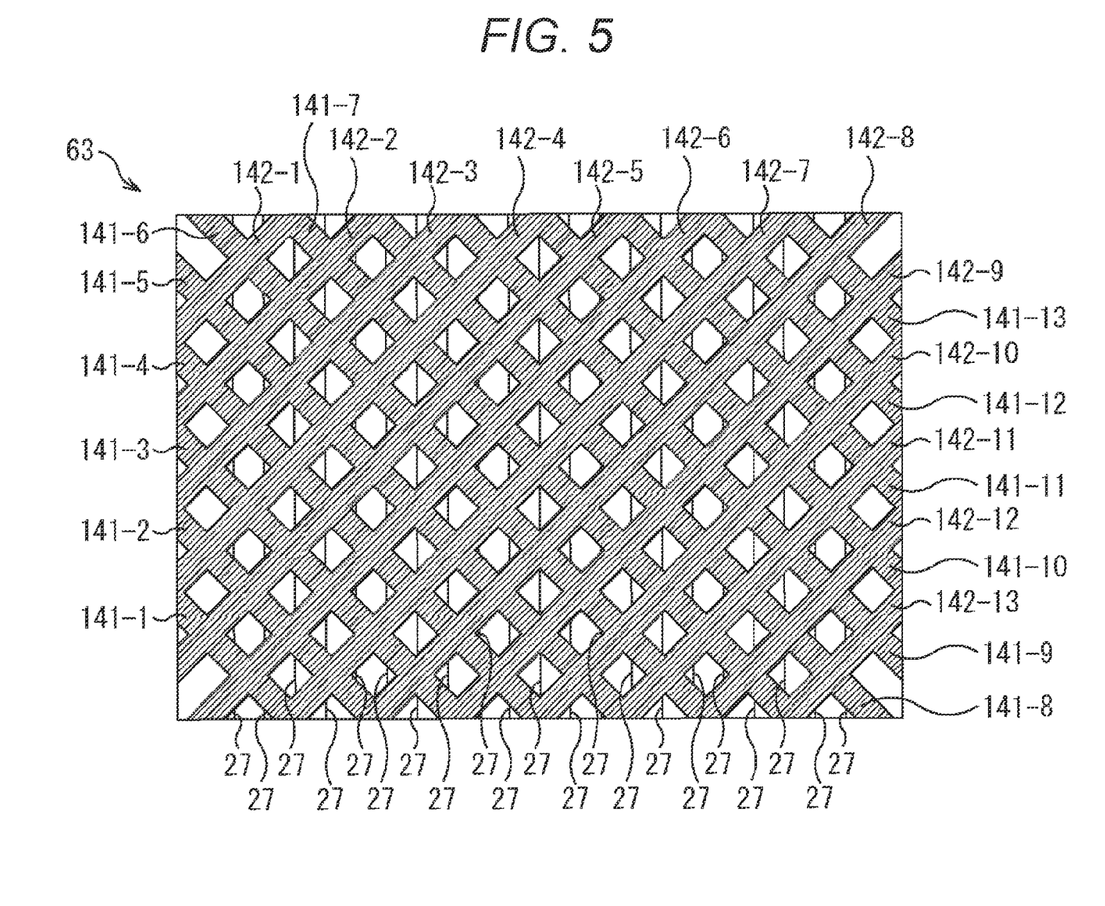
FIG. 5 is a diagram showing an example of a wiring pattern of the power supply wiring.

In the pixel array section 21 in the solid-state imaging device 11 according to the present technology, therefore, the power supply wiring 63 is provided in the wiring layer 57 in a wiring pattern shown in, for example, FIG. 5. FIG. 5 shows a view obtained when the pixel array section 21 shown in FIG. 2 is seen in a downward direction from the top in FIG. 2, i.e., the pixel array section 21 is seen from a normal line direction of the substrate 51.

In this example, the power supply wiring 63 includes wiring 141-1 to wiring 141-13 which are long in a left oblique upward direction in FIG. 5 and arranged at an equal interval between them in a lateral direction and wiring 142-1 to wiring 142-13 which are long in a right oblique upward direction in FIG. 5 and arranged at an equal interval between them in the lateral direction.

In a case where it is not necessary to especially make a discrimination among the wiring 141-1 to the wiring 141-13, the wiring is referred to simply as wiring 141 as well hereinafter. In a case where it is not necessary to especially make a discrimination among the wiring 142-1 to the wiring 142-13, the wiring is referred to simply as wiring 142 as well hereinafter. The wiring 141 and the wiring 142 are disposed to be nearly perpendicular in a lengthwise direction thereof.

Furthermore, in FIG. 5, a plurality of vertical signal lines 27 arranged in the illustrated lateral direction is disposed. In other words, the plurality of vertical signal lines 27 which is long in the illustrated longitudinal direction is arranged in the illustrated lateral direction, i.e., in a direction perpendicular to the lengthwise direction of the vertical signal lines 27.

As shown in FIG. 2, these vertical signal lines 27 are disposed right under the power supply wiring 63.

The wiring 141 and the wiring 142 included in the power supply wiring 63 are disposed to cross the plurality of vertical signal lines 27. Furthermore, the wiring 141 and the wiring 142 included in the power supply wiring 63 are disposed to cross each vertical signal line 27 in an oblique direction, i.e., to make a predetermined angle.

The area of a portion in each vertical signal line 27 overlapping the power supply wiring 63, i.e., the cover rate can be made nearly uniform by making the wiring pattern of the power supply wiring 63 such a pattern. As a result, variation of the load capacitance of the vertical signal lines 27 among pixels can be suppressed.

In the same way, the cover rate of the driver wiring connected to each pixel and wired long in the illustrated longitudinal direction or lateral direction with respect to the power supply wiring 63 can also be made nearly uniform.

Figure 6:
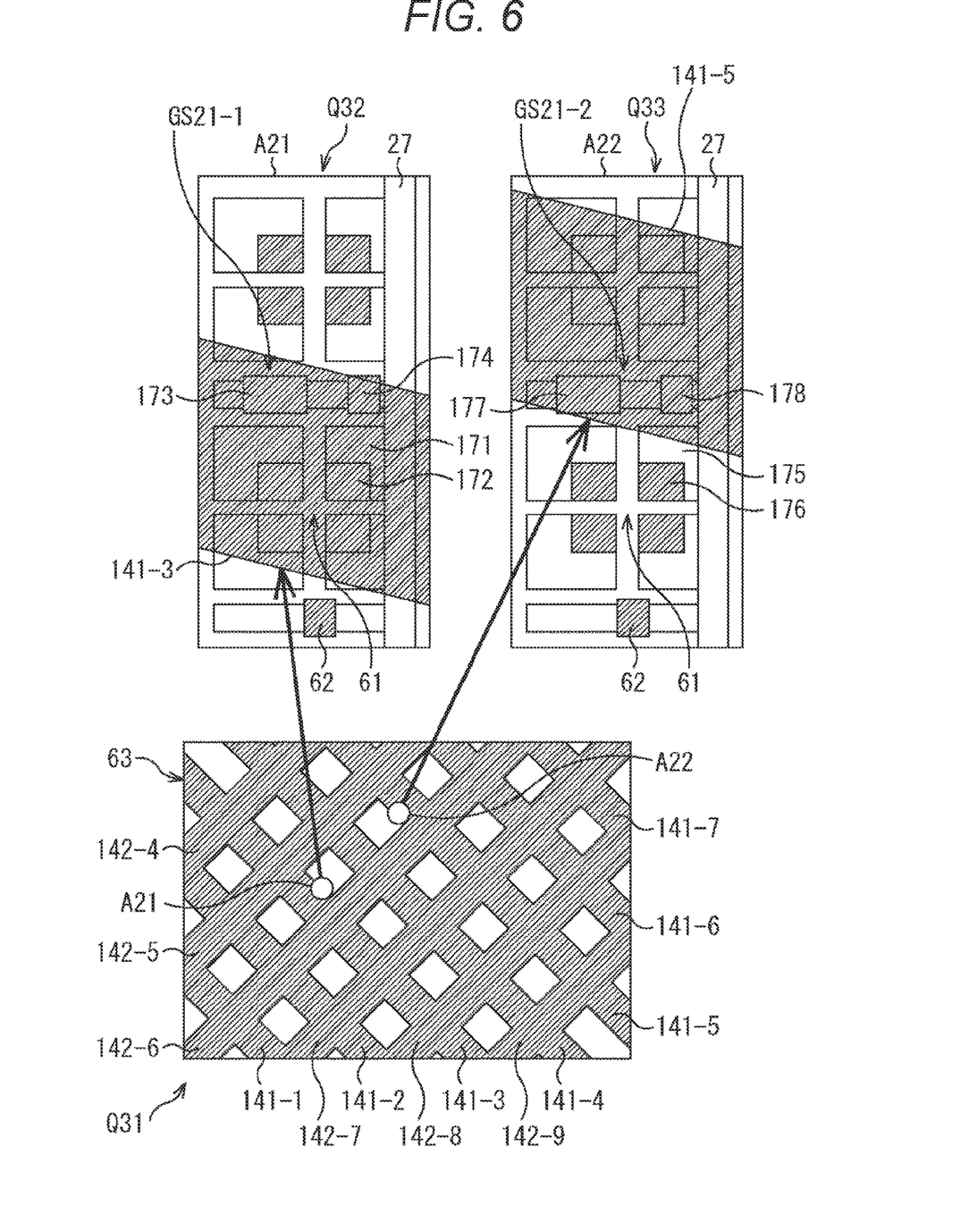
FIG. 6 is a diagram for explaining suppression of variation of power supply wiring and inter-wiring capacitance.

Focusing on different positions of the power supply wiring 63 as shown in, for example, FIG. 6, in pixels located under those positions, the cover rate of the pixel itself with respect to the power supply wiring 63 differs. Considering in the column direction, however, it is appreciated that the cover rate of each metal wiring such as the vertical signal line 27 with respect to the power supply wiring 63 is made nearly uniform.

FIG. 6 is a view obtained by seeing the pixel array section 21 in the solid-state imaging device 11 according to the present technology from a direction perpendicular to the light receiving plane, i.e., from a normal line direction of the substrate 51. In FIG. 6, portions corresponding to the case in FIG. 5 or FIG. 2 are denoted by like reference numerals and description thereof will be omitted.

In a case where the power supply wiring 63 in the wiring layer 57 is wired as indicated by an arrow Q31, several pixels and the vertical signal lines 27 connected to those pixels are disposed in a depth side of the illustrated region A21 where the power supply wiring 63 is wired, for example, as indicated by an arrow Q32. The diagram indicated by the arrow Q32 is an expanded view of a portion of the region A21 indicated by the arrow Q31.

Furthermore, in FIG. 6, the width of the wiring 141 is drawn narrower than the actual width to make the diagram easier to see.

In this example, a pixel GS21-1 is provided in the region A21. The pixel GS21-1 is provided in the depth side of the illustrated wiring layer 57. Furthermore, the pixel GS21-1 is connected to the one vertical signal line 27 which is long in the illustrated longitudinal direction (vertical direction).

In the pixel GS21-1, a photodiode 171 receives light from a subject, conducts photoelectric conversion, and stores charge obtained as a result. The photodiode 171 is a photoelectric conversion section which converts light incident from the subject to charge by photoelectric conversion, and is formed in the substrate 51.

Furthermore, if the floating diffusion region 61 is reset by the reset transistor 62, then charge stored in the photodiode 171 is transferred to the floating diffusion region 61 by a transfer transistor 172. Then, charge stored in the floating diffusion region 61 is converted to a voltage signal by an amplification transistor 173, and output to the vertical signal line 27 via a selection transistor 174. In this example, the floating diffusion region 61, the reset transistor 62, and the photodiode 171 to the selection transistor 174 are provided as elements included in the pixel GS21-1. The floating diffusion region 61, the reset transistor 62, and the photodiode 171 to the selection transistor 174 are provided in the substrate 51 and the wiring layer 52.

In this example, the pixel GS21-1 and a portion located near the pixel GS21-1 of the vertical signal line 27 connected to the pixel GS21-1 overlap the power supply wiring 63 (wiring 141) when seen from a direction perpendicular to the light receiving plane of the pixel array section 21. It is appreciated that the cover rate with respect to the power supply wiring 63 is high.

On the other hand, several pixels and the vertical signal line 27 connected to the pixels are also disposed on the depth side as well in an illustrated region A22 where the power supply wiring 63 is wired as indicated by an arrow Q33. The diagram indicated by the arrow Q33 is an expanded view of a portion of the region A22 indicated by the arrow Q31. Furthermore, in FIG. 6, the width of the wiring 141 is drawn narrower than the actual width to make the diagram easier to see.

In this example, a pixel GS21-2 is provided in the region A22. The pixel GS21-2 is connected to the vertical signal line 27 which is long in the illustrated longitudinal direction (vertical direction). Furthermore, the reset transistor 62, the floating diffusion region 61, a photodiode 175, a transfer transistor 176, an amplification transistor 177, and a selection transistor 178 are provided in the pixel GS21-2. The photodiode 175 to the selection transistor 178 are similar to the photodiode 171 to the selection transistor 174, and consequently description of them will be omitted.

In this example, the pixel GS21-2 and a portion located near the pixel GS21-2 of the vertical signal line 27 connected to the pixel GS21-2 do not overlap the power supply wiring 63 (the wiring 141) when seen from a direction perpendicular to the light receiving plane of the pixel array section 21, and the cover rate with respect to the power supply wiring 63 is low. When considering in a direction of a column of pixels arranged along the vertical signal line 27, i.e., in an up-down direction in FIG. 6, however, it is appreciated that the cover rate of the vertical signal line 27 connected to the pixel GS21-2 with respect to the power supply wiring 63 (cover rate of a pixel column) becomes nearly the same as in the case of the pixel GS21-1.

If the power supply wiring 63 is wired to make the cover rate of each pixel with respect to the power supply wiring 63 nearly uniform, variation of the inter-wiring capacitance and the load capacitance for each pixel can be suppressed and an image with higher quality can be obtained.

As described heretofore, it is possible in the solid-state imaging device 11 to reduce the load capacitance of the vertical signal line 27 and improve the conversion efficiency from the charge to the voltage signal in the floating diffusion region 61 by providing the vertical signal line 27 right under the power supply wiring 63 apart from the floating diffusion region 61.

Furthermore, it is possible to suppress the variation of inter-wiring capacitance of each wiring, the load capacitance of the vertical signal line 27, and the like by disposing the power supply wiring 63 to make the cover rate of each metal wiring such as driver wiring of an element such as the reset transistor 62 and the vertical signal line 27 with respect to the power supply wiring 63 nearly uniform. As a result, it is possible to suppress occurrence of the deviation in the black level, variation of charge transfer, and variation of settling and an image with higher quality can be obtained.

Second Embodiment

Regarding Wiring Pattern of Power Supply Wiring

In the foregoing description, the power supply wiring 63 provided in the wiring layer 57 has the wiring pattern shown in FIG. 5. However, any wiring pattern may be used as long as the wiring pattern makes the cover rate of metal wiring such as a vertical signal line 27 with respect to the power supply wiring 63 nearly uniform.

Figure 7:
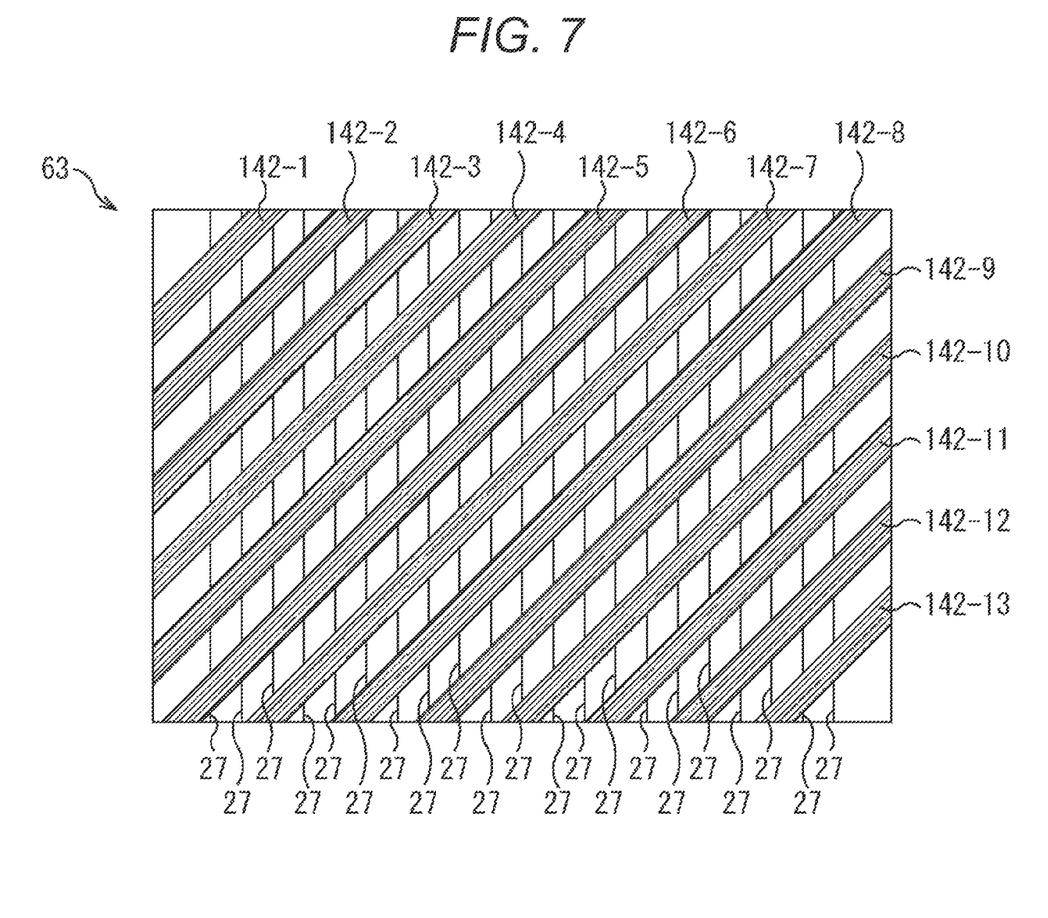
FIG. 7 is a diagram showing an example of a wiring pattern of power supply wiring.

The power supply wiring 63 may be provided in the wiring layer 57 in a wiring pattern shown in, for example, FIG. 7. FIG. 7 shows a view obtained by seeing the pixel array section 21 shown in FIG. 2 in a downward direction from the top in FIG. 2, i.e., in a normal line direction of a substrate 51. In FIG. 7, portions corresponding to the case in FIG. 5 are denoted by like reference numerals, and description of them will be omitted suitably.

In this example, the power supply wiring 63 includes wiring 142-1 to wiring 142-13 which are long in an illustrated right oblique upward direction and which are arranged in a lateral direction at an equal interval between them. The width in a short hand direction of wiring 142 is made wider than the width of each pixel provided in the pixel array section 21.

Each wiring 142 included in the power supply wiring 63 is disposed to cross a plurality of vertical signal lines 27.

Furthermore, each wiring 142 included in the power supply wiring 63 is disposed to make a predetermined angle to each vertical signal line 27. It is possible to make the cover rate of each vertical signal line 27 with respect to the power supply wiring 63 nearly uniform and suppress the variation of inter-wiring capacitance of the pixels and load capacitance of the vertical signal lines 27 by making the wiring pattern of the power supply wiring 63 such a pattern.

In the same way, for example, the cover rate of the driver wiring which is wired long in the illustrated longitudinal direction or lateral direction and connected to each pixel with respect to the power supply wiring 63 can also be made nearly uniform.

Third Embodiment

Regarding Wiring Pattern of Power Supply Wiring

Figure 8:
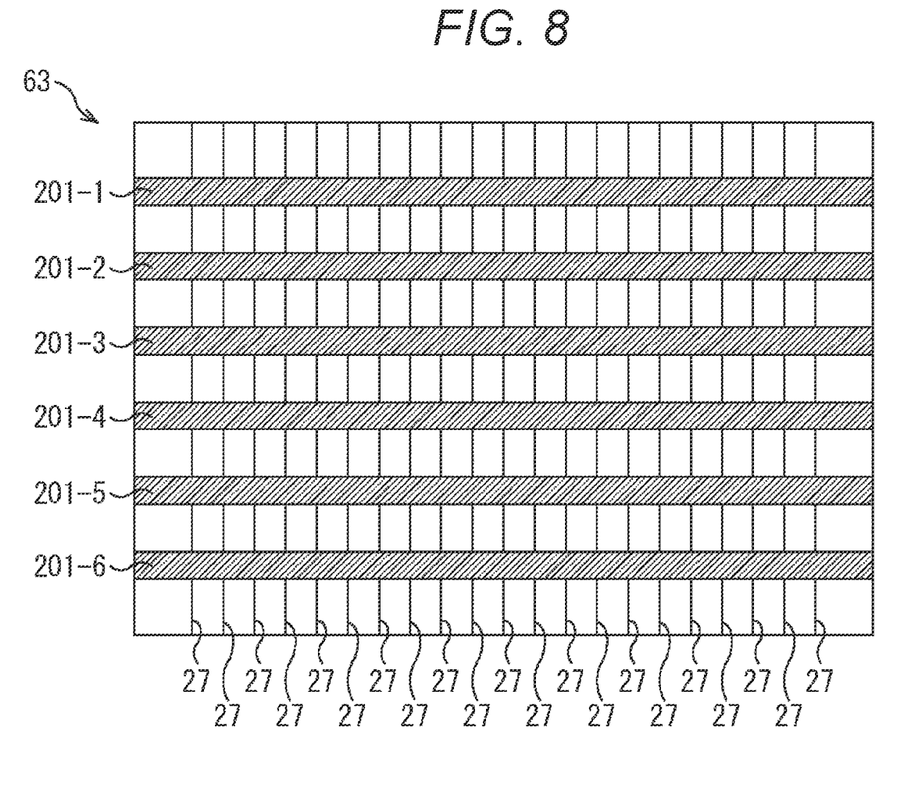
FIG. 8 is a diagram showing an example of a wiring pattern of power supply wiring.

In addition, power supply wiring 63 may be provided in a wiring layer 57 in a wiring pattern shown in, for example, FIG. 8. FIG. 8 shows a view obtained by seeing the pixel array section 21 shown in FIG. 2 in a downward direction from the top in FIG. 2. In FIG. 8, portions corresponding to the case in FIG. 5 are denoted by like reference numerals, and description of them will be omitted suitably.

In this example, the power supply wiring 63 includes wiring 201-1 to wiring 201-6 which are long in an illustrated lateral direction and which are arranged in a longitudinal direction at an equal interval between them.

The wiring 201-1 to the wiring 201-6 are disposed to cross all vertical signal lines 27. The wiring 201-1 to the wiring 201-6 are hereinafter referred to simply as wiring 201 as well unless it is necessary to especially make a discrimination among them.

Each wiring 201 has the same width. The width in the short hand direction of the wiring 201 is made wider than the width of each pixel provided in the pixel array section 21.

Each wiring 201 included in the power supply wiring 63 is disposed to cross each vertical signal line 27 at a nearly right angle. It is possible to make the cover rate of each vertical signal line 27 with respect to the power supply wiring 63 nearly uniform and suppress the variation of inter-wiring capacitance of the pixels and load capacitance of the vertical signal lines 27 by making the wiring pattern of the power supply wiring 63 such a pattern.

In the same way, for example, the cover rate of the driver wiring which is wired long in the illustrated longitudinal direction or lateral direction and connected to each pixel with respect to the power supply wiring 63 can also be made nearly uniform.

Fourth Embodiment

Regarding Wiring Pattern of Power Supply Wiring

Figure 9:
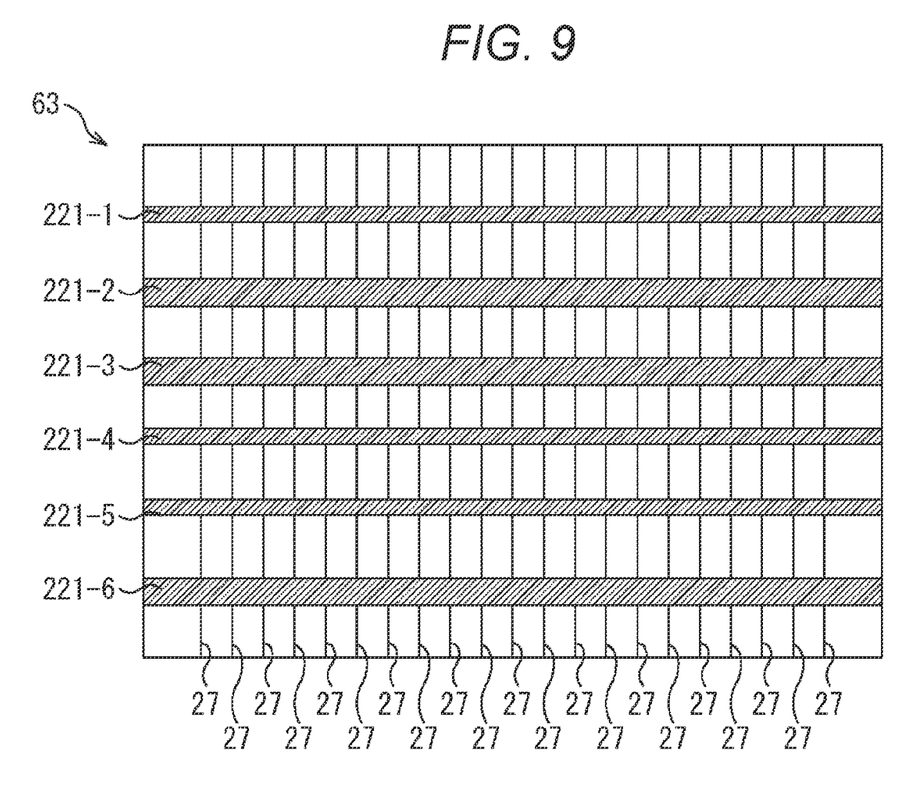
FIG. 9 is a diagram showing an example of a wiring pattern of power supply wiring.

Furthermore, power supply wiring 63 may be provided in a wiring layer 57 in a wiring pattern shown in, for example, FIG. 9. FIG. 9 shows a view obtained by seeing the pixel array section 21 shown in FIG. 2 in a downward direction from the top in FIG. 2. In FIG. 9, portions corresponding to the case in FIG. 5 are denoted by like reference numerals, and description of them will be omitted suitably.

In this example, the power supply wiring 63 includes wiring 221-1 to wiring 221-6 which are long in an illustrated lateral direction and which are arranged in a longitudinal direction at an equal interval between them.

The wiring 221-1 to the wiring 221-6 are disposed to cross all vertical signal lines 27. The wiring 221-1 to the wiring 221-6 are hereinafter referred to simply as wiring 221 as well unless it is necessary to especially make a discrimination among them.

The wiring 221 has a width different from each other.

The width in the short hand direction of each wiring 221 is made wider than the width of each pixel provided in the pixel array section 21.

Each wiring 221 included in the power supply wiring 63 is disposed to cross each vertical signal line 27 at a right angle. The wiring pattern shown in FIG. 9 differs from the wiring pattern shown in FIG. 8 in that the wiring 221 is not uniform in width.

It is possible to make the cover rate of each vertical signal line 27 with respect to the power supply wiring 63 nearly uniform and suppress the variation of inter-wiring capacitance of the pixels and load capacitance of the vertical signal lines 27 by making the wiring pattern of the power supply wiring 63 such a pattern.

In the same way, for example, the cover rate of the driver wiring which is wired long in the illustrated longitudinal direction or lateral direction and connected to each pixel with respect to the power supply wiring 63 can also be made nearly uniform.

In the case where the power supply wiring 63 is wired in the wiring pattern shown in FIG. 8 or FIG. 9, the present technology can also be applied to an ordinary image sensor which is not a back-irradiation type image sensor.

Here, the ordinary image sensor is an image sensor having a configuration in which a wiring layer is provided between an on-chip lens and a photodiode.

Fifth Embodiment

Regarding Wiring Pattern of Power Supply Wiring

Figure 10:
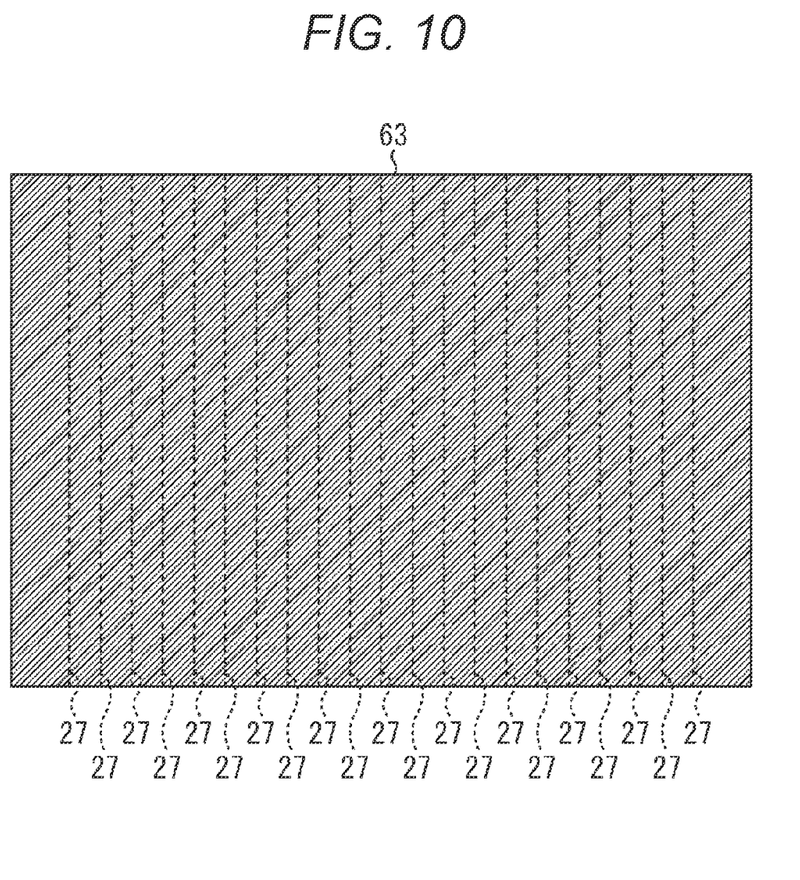
FIG. 10 is a diagram showing an example of a wiring pattern of power supply wiring.

In addition, power supply wiring 63 may be provided in a wiring layer 57 in a wiring pattern shown in, for example, FIG. 10. FIG. 10 shows a view obtained by seeing the pixel array section 21 shown in FIG. 2 in a downward direction from the top in FIG. 2. In FIG. 10, portions corresponding to the case in FIG. 5 are denoted by like reference numerals, and description of them will be omitted suitably.

In this example, the power supply wiring 63 is provided to cover the whole face of the wiring layer 57, i.e., to cover the whole face of the pixel array section 21. In this case, therefore, all vertical signal lines 27 are covered by the power supply wiring 63. Accordingly, it is possible to make the cover rate of each vertical signal line 27 with respect to the power supply wiring 63 uniform. It is possible to suppress the variation of the inter-wiring capacitance of the pixels and the variation of the load capacitance of the vertical signal lines 27.

In the same way, the cover rate of driver wiring which is wired long in the illustrated longitudinal direction or lateral direction and which is connected to each pixel with respect to the power supply wiring 63 can also be made uniform.

(Configuration Example of Imaging Apparatus)

In addition, the present technology can be applied to an electronic device in general using a solid-state imaging device in a photoelectric conversion section, such as an imaging apparatus including a digital still camera and a video camera, a portable terminal device having an imaging function, and a duplicating machine using a solid-state imaging device in an image reading section.

The solid-state imaging device may have a form formed as one chip or may have a module form having an imaging function in which an imaging section and a signal processing section or an optical system are packaged collectively.

Figure 11:
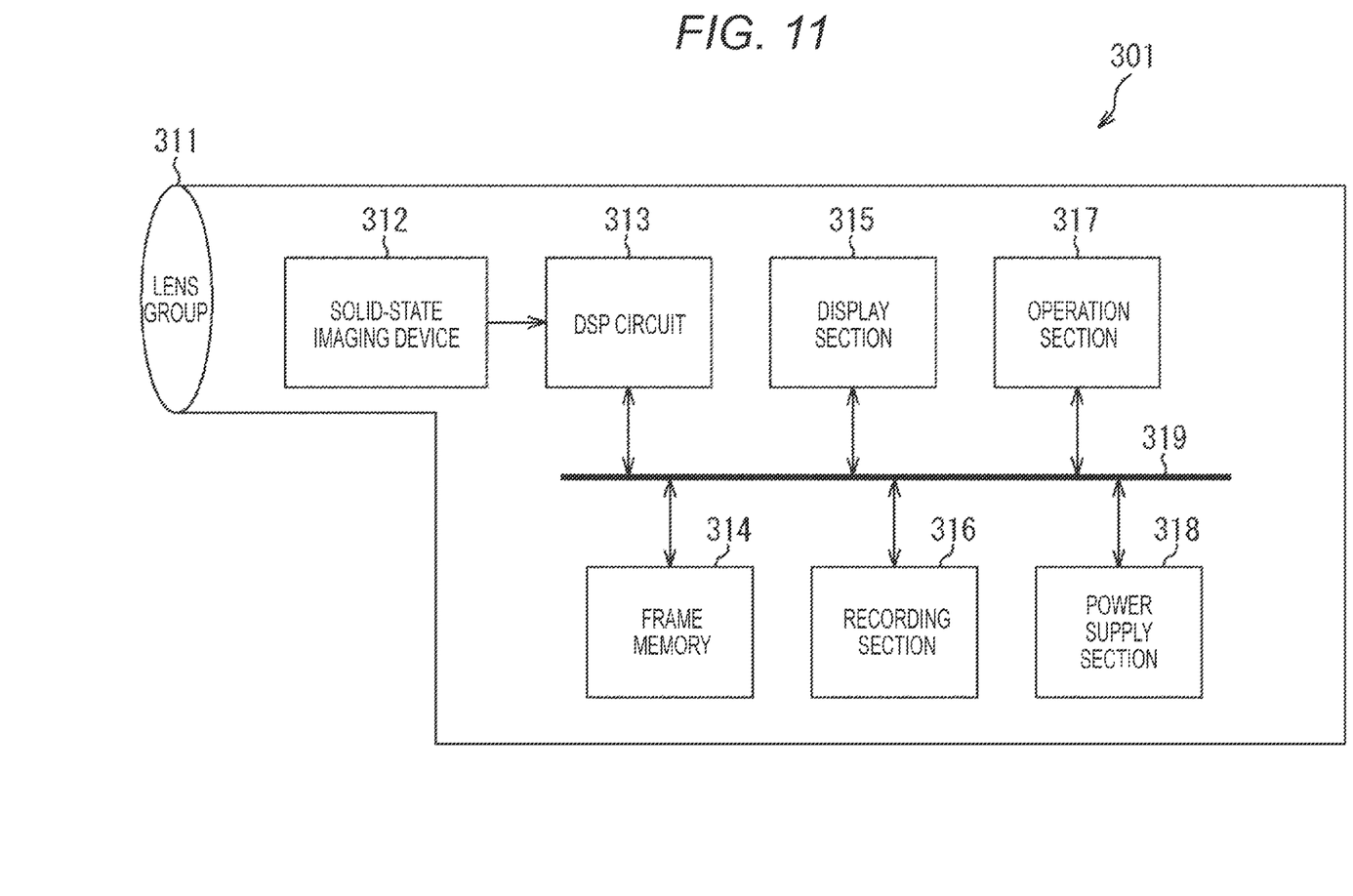
FIG. 11 is a diagram showing a configuration example of an imaging apparatus.

FIG. 11 is a diagram showing a configuration example of an imaging apparatus as an electronic device according to the present technology.

An imaging apparatus 301 in FIG. 11 includes an optical section 311 including a lens group, a solid-state imaging device (imaging device) 312, and a DSP (Digital Signal Processor) circuit 313 which is a camera signal processing circuit. Furthermore, the imaging apparatus 301 includes a frame memory 314, a display section 315, a recording section 316, an operation section 317, and a power supply section 318 as well. The DSP circuit 313, the frame memory 314, the display section 315, the recording section 316, the operation section 317, and the power supply section 318 are connected to each other via a bus line 319.

The optical section 311 takes in incident light (image light) from a subject and forms an image on an imaging plane of the solid-state imaging device 312. The solid-state imaging device 312 converts the light quantity of the incident light with which the image is formed on the imaging plane by the optical section 311 to an electric signal with a pixel taken as the unit, and outputs the electric signal as a pixel signal. The solid-state imaging device 312 corresponds to the above-described solid-state imaging device 11.

The display section 315 includes a panel type display device such as, for example, a liquid crystal panel or an organic EL (electro luminescence) panel, and displays a moving image or a still image picked up by the solid-state imaging device 312. The recording section 316 records a moving image or a still image picked up by the solid-state imaging device 312 on a recording medium such as a video tape or a DVD (Digital Versatile Disk).

The operation section 317 issues an operation command concerning various functions the imaging apparatus 301 has, under operation by a user. The power supply section 318 supplies various power supplies which become operation power supplies of the DSP circuit 313, the frame memory 314, the display section 315, the recording section 316 and the operation section 317, to these supply targets suitably.

In the description of the above-described embodiments, the case where the embodiments are applied to a CMOS image sensor in which pixels detecting signal charge depending upon the light quantity of visible light as a physical quantity are arranged in a matrix form is taken as an example. However, the present technology is not restricted to the application to the CMOS image sensor, but can be applied to a solid-state imaging device in general.

Furthermore, embodiments of the present technology are not restricted to the above-described embodiments, but various changes can be made without departing from the spirit of the present technology.

In addition, the effects described in the present specification are merely described by way of example and are not restricted. There may be other effects.

In addition, it is possible that the present technology has configurations described below.

(1)
A solid-state imaging device including:
a substrate including a photoelectric conversion section provided for each pixel to receive light incident from a subject and conduct photoelectric conversion;
a first wiring layer provided on the substrate to have wiring connected to the pixel; and
a second wiring layer provided on the substrate to have power supply wiring wired to make an area of a region in each of the wiring overlapping the power supply wiring nearly uniform when seen from a normal line direction of the substrate.

(2)
The solid-state imaging device according to (1), wherein the first wiring layer is disposed between the substrate and the second wiring layer.

(3)
The solid-state imaging device according to (1) to (2), wherein in the first wiring layer, the wiring which is long in a predetermined direction is arranged in a plurality in a direction perpendicular to the predetermined direction.

(4)
The solid-state imaging device according to any one of (1) to (3), wherein the power supply wiring is disposed to make a predetermined angle to the wiring when seen from the normal line direction.

(5)
The solid-state imaging device according to (4), wherein in the second wiring layer, the power supply wiring which is long in a first direction and the power supply wiring which is long in a second direction perpendicular to the first direction are provided.

(6)
The solid-state imaging device according to any one of (1) to (3), wherein the power supply wiring is disposed to cross the wiring at a nearly right angle when seen from the normal line direction.

(7)
The solid-state imaging device according to (6), wherein a plurality of the power supply wiring which is different in width from each other is provided in the second wiring layer.

(8)
The solid-state imaging device according to any one of (1) to (7), wherein the first wiring layer is provided right under the second wiring layer.

(9)
The solid-state imaging device according to any one of (1) to (8), wherein the wiring is a signal line provided to read out a voltage signal depending upon charge obtained by the photoelectric conversion section.

(10)
The solid-state imaging device according to any one of (1) to (8), wherein the wiring is driver wiring provided to drive elements provided in the pixel.

(11)
The solid-state imaging device according to any one of (1) to (10), wherein the solid-state imaging device is a back-irradiation type imaging device.

(12)
The solid-state imaging device according to any one of (1) to (11), wherein the power supply wiring is wider in width than the pixel.

(13)
An electronic device including a solid-state imaging device, the solid-state imaging device including:
a substrate including a photoelectric conversion section provided for each pixel to receive light incident from a subject and conduct photoelectric conversion;
a first wiring layer provided on the substrate to have wiring connected to the pixel; and
a second wiring layer provided on the substrate to have power supply wiring wired to make an area of a region in each of the wiring overlapping the power supply wiring nearly uniform when seen from a normal line direction of the substrate.

REFERENCE SIGNS LIST

11 Solid-state imaging device
21 Pixel array section
26 Pixel drive line
27 Vertical signal line
51 Substrate
56 Wiring layer
57 Wiring layer
61 Floating diffusion region
63 Power supply wiring
301 Imaging apparatus

The invention claimed is:
1. An imaging device comprising:
a substrate including a plurality of pixels, wherein each pixel of the plurality of pixels includes a photoelectric conversion section;
a first wiring layer including a plurality of wirings coupled to the plurality of pixels, wherein the plurality of wirings of the first wiring layer extend in a first direction parallel to a light-incident surface of the substrate; and a second wiring layer including one or more power supply wirings that overlap adjacent wirings of the plurality of wirings of the first wiring layer in a second direction perpendicular to the light-incident surface of the substrate, wherein, an area of regions where the one or more power supply wirings overlap the plurality of wirings of the first wiring layer are substantially uniform, and the one or more power supply wirings extend in a third direction parallel to the light-incident surface of the substrate and overlap the plurality of wirings of the first wiring layer at an oblique angle.

2. The imaging device according to claim 1, wherein the first wiring layer is disposed between the substrate and the second wiring layer.

3. The imaging device according to claim 1, wherein the second wiring layer includes one or more power supply wirings that extend in a fourth direction parallel to the light-incident surface of the substrate and perpendicular to the third direction.

4. The imaging device according to claim 1, wherein the second wiring layer is disposed on the first wiring layer.

5. The imaging device according to claim 1, wherein at least one wiring of the plurality of wirings is a signal line provided to read out a voltage signal depending upon charge obtained by one or more photoelectric conversion sections.

6. The imaging device according to claim 1, wherein at least one wiring of the plurality of wirings is driver wiring provided to drive elements provided in the pixel.

7. The imaging device according to claim 1, wherein the imaging device is a back-irradiation type imaging device.

8. The imaging device according to claim 1, wherein at least one power supply wiring of the one or more power supply wirings is wider in a direction parallel to the light-incident surface of the substrate than a width of a pixel.

9. An electronic device including an imaging device, the imaging device comprising:

a substrate including a plurality of pixels, wherein each pixel of the plurality of pixels includes a photoelectric conversion section;

a first wiring layer including a plurality of wirings coupled to the plurality of pixels, wherein the plurality of wirings of the first wiring layer extend in a first direction parallel to a light-incident surface of the substrate; and a second wiring layer including one or more power supply wirings that overlap the plurality of wirings of the first wiring layer in a second direction perpendicular to the light-incident surface of the substrate, wherein, an area of regions where the one or more power supply wirings overlap the plurality of wirings of the first wiring layer are substantially uniform, and the one or more power supply wirings extend in a third direction parallel to the light-incident surface of the substrate and overlap the plurality of wirings of the first wiring layer at an oblique angle.

10. The electronic device according to claim 9, wherein the first wiring layer is disposed between the substrate and the second wiring layer.

11. The electronic device according to claim 9, wherein the second wiring layer includes one or more power supply wirings that extend in a fourth direction parallel to the light-incident surface of the substrate and perpendicular to the third direction.

12. The electronic device according to claim 9, wherein the second wiring layer is disposed on the first wiring layer.

13. The electronic device according to claim 9, wherein at least one wiring of the plurality of wirings is a signal line provided to read out a voltage signal depending upon charge obtained by one or more photoelectric conversion sections.

14. The electronic device according to claim 9, wherein at least one wiring of the plurality of wirings is driver wiring provided to drive elements provided in the pixel.

15. The electronic device according to claim 9, wherein the imaging device is a back-irradiation type imaging device.

16. The electronic device according to claim 9, wherein at least one power supply wiring of the one or more power supply wirings is wider in a direction parallel to the light-incident surface of the substrate than a width of a pixel.

* * * * *